United States Patent
Kobayashi et al.

(10) Patent No.: US 9,371,427 B2
(45) Date of Patent: Jun. 21, 2016

(54) PATTERN FORMING METHOD

(71) Applicant: KABUSHIKI KAISHA TOSHIBA, Tokyo (JP)

(72) Inventors: Katsutoshi Kobayashi, Hachiouji Tokyo (JP); Yusuke Kasahara, Yokohama Kanagawa (JP); Hiroki Yonemitsu, Chigasasaki Kanagawa (JP); Hitoshi Kubota, Yokohama Kanagawa (JP); Ayako Kawanishi, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/636,034

(22) Filed: Mar. 2, 2015

(65) Prior Publication Data

US 2016/0060410 A1 Mar. 3, 2016

(30) Foreign Application Priority Data

Sep. 3, 2014 (JP) ................... 2014-179359

(51) Int. Cl.
| | |
|---|---|
| *C23F 1/00* | (2006.01) |
| *C08J 7/00* | (2006.01) |
| *B81C 1/00* | (2006.01) |
| *C23F 4/00* | (2006.01) |

(52) U.S. Cl.
CPC ............... *C08J 7/00* (2013.01); *B81C 1/00396* (2013.01); *C23F 1/00* (2013.01); *C23F 4/00* (2013.01); *C08J 2300/22* (2013.01); *C08J 2400/22* (2013.01)

(58) Field of Classification Search
None
See application file for complete search history.

(56) References Cited

U.S. PATENT DOCUMENTS

| | | | | |
|---|---|---|---|---|
| 7,799,697 B2 * | 9/2010 | Shiu | ................... | H01L 21/0337 438/734 |
| 7,898,768 B2 | 3/2011 | Kamata et al. | | |
| 8,828,253 B2 | 9/2014 | Koole et al. | | |
| 8,920,664 B2 | 12/2014 | Seino et al. | | |
| 2010/0167214 A1* | 7/2010 | Yoon | ................... | B81C 1/00031 430/323 |
| 2011/0147983 A1* | 6/2011 | Cheng | ................ | B81C 1/00031 264/220 |
| 2013/0075360 A1* | 3/2013 | Nakamura | ............ | G03F 7/0002 216/41 |
| 2013/0133825 A1* | 5/2013 | Hattori | ................ | B81C 1/00031 156/272.2 |
| 2013/0140272 A1* | 6/2013 | Koole | ................. | B81C 1/00031 216/38 |
| 2014/0148012 A1* | 5/2014 | Guillorn | ............. | B81C 1/00031 438/700 |
| 2014/0273511 A1* | 9/2014 | Farrell | ................ | H01L 21/0337 438/763 |
| 2015/0118625 A1* | 4/2015 | Yang | ...................... | B82Y 10/00 430/296 |
| 2015/0153649 A1* | 6/2015 | Lee | .......................... | G06F 7/40 216/47 |

(Continued)

FOREIGN PATENT DOCUMENTS

| | | |
|---|---|---|
| JP | 2007-250091 | 9/2007 |
| JP | 4543004 | 9/2010 |

*Primary Examiner* — Anita Alanko
(74) *Attorney, Agent, or Firm* — Patterson & Sheridan, LLP

(57) ABSTRACT

A pattern is formed by forming a first pattern on a first film, forming a block copolymer layer including a first block chain and a second block chain on the first pattern, forming a second pattern, forming a second film on the second pattern, selectively removing the second film until the second pattern is exposed, forming a third pattern, and processing the first film using the third pattern as a mask. The second pattern is formed by microphase-separating the block copolymer layer, and removing the first block chain or the second block chain. The second film is formed by applying a material having an etch rate that is less than an etch rate of a material of the first pattern and the second pattern. The third pattern is formed by selectively removing the second pattern and the first pattern using the second film as a mask.

20 Claims, 4 Drawing Sheets

(56) References Cited

U.S. PATENT DOCUMENTS

2015/0206548 A1* 7/2015 Yang .................. G11B 5/855 425/385

2015/0210812 A1* 7/2015 deVilliers ................ B81C 1/00 216/41

2015/0228298 A1* 8/2015 Han ..................... G11B 5/8404 428/836.1

* cited by examiner

FIG. 8

| TYPE OF PROCESSED FILM | ORGANIC MATERIAL | Si | SiO | SiN | Metal |
|---|---|---|---|---|---|
| WET (SOLUTION) | H$_2$SO$_4$, H$_2$O$_2$ | HF + HNO$_3$ + CH$_3$COOH | BHF, DHF | H$_3$PO$_4$ + HNO$_3$ | HCl + H$_2$O$_2$ |
| DRY (GAS) | O$_2$, N$_2$, H$_2$ | HBr, Cl$_2$ | CF$_4$, CHF$_3$ | CHF$_3$, CH$_2$F$_2$ | Cl$_2$, BCl$_2$ |

PATTERN FORMING METHOD

CROSS-REFERENCE TO RELATED APPLICATION

This application is based upon and claims the benefit of priority from Japanese Patent Application No. 2014-179359, filed Sep. 3, 2014, the entire contents of which are incorporated herein by reference.

FIELD

Embodiments described herein relate generally to a pattern forming method.

BACKGROUND

As the size of features formed during the manufacture of a semiconductor device has shrunk, and nanometer dimensioned features have been processed, a new technology replacing conventional photolithography is needed.

As one such technology, self-assembling lithography has attracted attention. The self-assembling lithography process is a method that forms a fine pattern through phase-separation of a liquid mixture of a block copolymer applied onto a substrate. The phase-separation forms an ordered structure having nanometer scale features on a to-be-processed underlying film by removing one block polymer chain, and processing the to-be-processed film using the other block polymer chain as a mask.

As a method for controlling formation of a regular and directionally oriented ordered pattern using the natural phase-separation of the block copolymer, a directed self-assembly (DSA) technology is used, which includes forming a guide pattern on the to-be-processed film by photolithography, and applying the block copolymer onto the guide pattern. The guide pattern forms a desired order or template for developing the DSA patterns using the natural phase-separation of the block copolymer.

However, when the to-be-processed film is etched using one of the block polymer chains as a mask, amount of processing in to-be-processed film in the region which the guide pattern is formed is different from the one which the guide pattern is not formed. In this case, unevenness or roughness in the pattern is sometimes produced due to the influence of the guide pattern, for example, the roughness may be equivalent to a thickness of the guide pattern.

DESCRIPTION OF THE DRAWINGS

FIG. 8 is a table depicting examples of an aqueous solution and a gas which are usable according to a type of a to-be-processed film.

DETAILED DESCRIPTION

Figure 1:
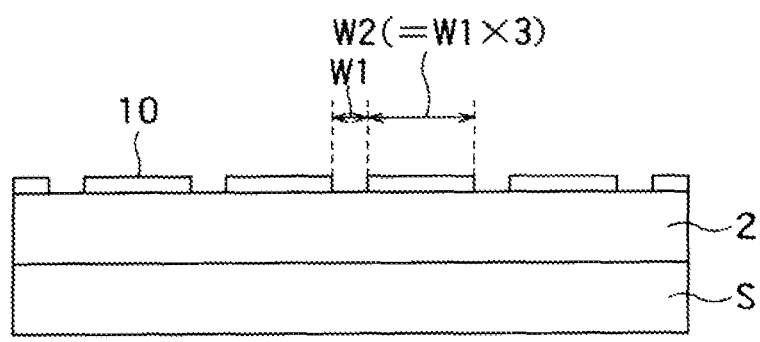
FIGS. 1-7 are partial cross-sectional views schematically illustrating a pattern forming method according to an embodiment.

The exemplary embodiments provide a pattern forming method which suppresses unevenness or roughness in a formed pattern.

In general, according to one embodiment, a pattern forming method includes forming a first pattern on a first film, forming a second pattern on the first pattern, forming a second film, forming a third pattern, and processing the first film using the third pattern as a mask. The second pattern is formed by microphase-separating a block copolymer layer after forming the block copolymer layer including a first block polymer chain and a second block polymer chain on the first pattern, and removing one of the separated first polymer block chain or the second polymer block chain. The second film is formed by covering the second pattern by applying a second material having an etch rate that is less than an etch rate of a material of the first pattern and the second pattern. The third pattern is formed by selectively removing portions of the first pattern exposed in openings of the third pattern using the second pattern of the second film as a mask, after selectively removing the second film until the second pattern is exposed, and removing the second pattern using the second film as a mask. The third pattern includes a first portion that includes the first pattern and the second film on the first pattern, and a second portion that includes the second film which is arranged on the first film, and of which a film thickness is thicker than the second film of the first portion by a thickness of the first pattern.

Hereinafter, the embodiments will be described with reference to the drawings. In the drawings, the same reference numerals are assigned to the same elements, and the additional description thereof will be appropriately omitted for brevity. Moreover, the accompanying drawings are to explain the description of each embodiment and to prompt the understanding thereof, and it should be noted that shapes, sizes, ratios, or the like in each drawing may be different from those of a real device.

Herein, the term "layered" includes one or more layers being overlapped or stacked one over the other by interposing another layer therebetween, in addition to one or more layers being overlapped or stacked one over the other by coming in contact with each other. Moreover, the term "arranged on" includes one or more layers being arranged by interposing another layer therebetween, in addition to one or more layers being arranged by directly coming in contact therewith. Furthermore, directional terms such as top and bottom in the description, indicate the relative directions, wherein a to-be-processed film formed on a face side of a substrate (described later) is assumed to be the top side of the substrate. Hence, the directions thereof may be different from actual directions using gravity as a reference.

FIG. 1 to FIG. 7 are partial cross-sectional views schematically illustrating the description of the pattern forming method according to the embodiment.

First, as shown in FIG. 1, a guide pattern 10 is formed on a to-be-processed film 2 which is arranged on a substrate S.

The substrate S may be a glass substrate or a ceramic substrate, in addition to a semiconductor substrate. As a to-be-processed film 2, for example, a hard mask which is formed of silicon oxide ($SiO_2$), is used in the embodiment. The type of the to-be-processed film 2 is not particularly limited to silicon oxide ($SiO_2$), and may be for example, silicon nitride (SiN), Si, a metal or an organic material (see FIG. 8).

In the embodiment, if a mask pattern is a line and space pattern where a pattern of a width W1 is repeatedly formed in a direction parallel to a surface of the substrate S having a gap between the lines of the width W1 (see FIG. 6), the guide pattern 10 is a line and space pattern where the pitch of a width W2 (=W1×3) is repeatedly formed in the same direction as the mask pattern having a desired gap of the width W1.

In the embodiment, for example, corresponding to a first pattern, the guide pattern 10 is formed of a material having an affinity to both of a first block polymer chain and a second block polymer chain described later. In the embodiment, example, such material having the affinity to both of the block polymer chains, corresponds to a first material.

Next, after applying a block copolymer having the first block polymer chain and the second block polymer chain on the guide pattern 10, a structure having a repeating pattern is formed as a result of microphase-separation of the block copolymer.

Figure 2:
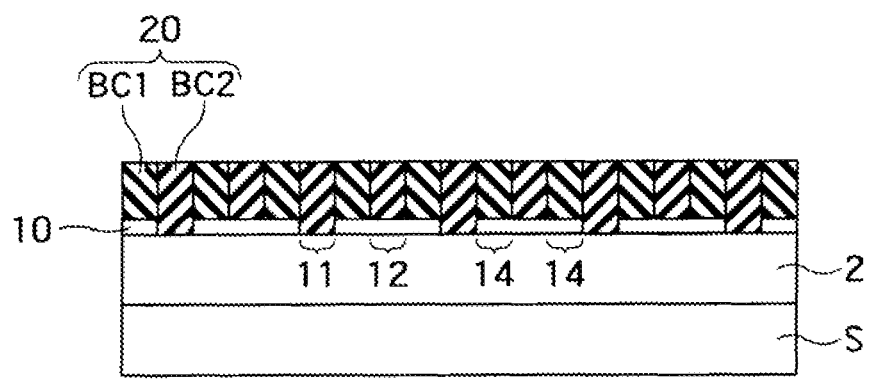

More specifically, for example, when the copolymer of polystyrene (PS) and polymethyl methacrylate (PMMA), is used as a block copolymer, for example, a layered body of FIG. 2 is heated for approximately 1 minute on a hot plate at approximately 200 degrees. Hereby, the block copolymer is microphase-separated, and a self-assembly pattern 20 which includes a first polymer unit BC1 having the first block polymer chain and a second polymer unit BC2 having the second block polymer chain, is formed.

For example, when polystyrene (PS) is assumed to be the first block polymer chain, and the polymethyl methacrylate (PMMA) is the second block polymer chain, the first polymer unit BC1 containing the PS, is formed in a depression 11 of the guide pattern 10 and a center region 12 of a protrusion of the guide pattern 10. Additionally, for example, the second polymer unit BC2 containing the PMMA, is formed in an end unit region 14 on each side of the center region 12 of the protrusion of the guide pattern 10.

Furthermore, in the above description, although the polystyrene (PS) is assumed to be the first block polymer chain, and the polymethyl methacrylate (PMMA) is assumed to be the second block polymer chain, since the numerals such as first and second only relative numerical designation as between the block polymer chains, for example, the polystyrene (PS) may be specified as the second block polymer chain, and the polymethyl methacrylate (PMMA) may be specified as the first block polymer chain.

The usable block copolymers are not limited to PS-PMMA described above, and may be, for example, polybutadiene-polydimethylsiloxanepolybutadiene-4-vinylpyridine, polybutadiene-methyl methacrylate, polybutadiene-poly-t-butyl methacrylate, polybutadiene-t-butyl acrylate, poly-t-butyl methacrylate-poly-4-vinylpyridine, polyethylene-polymethyl methacrylate, poly-t-butyl methacrylate-poly-2-vinylpyridine, polyethylene-poly-2-vinylpyridine, polyethylene-poly-4-vinylpyridine, polyisoprene-poly-2-vinylpyridine, poly-t-butyl methacrylate-polystyrene, polymethyl acrylate-polystyrene, polybutadiene-polystyrene, polystyrene-poly-2-vinylpyridine, polystyrene-poly-N,N-dimethylacrylamide, polybutadiene-sodium polyacrylate, polybutadiene-polyethylene oxide, poly-t-butyl methacrylate-polyethylene oxide, polystyrene-polyacrylic acid, polystyrene-polymethacrylic acid, polystyrene-polyethylene oxide, polystyrene-polydimethylsiloxane, polystyrene-polyisoprene, polystyrene-poly-4-vinylpyridine, polymethacrylate containing polymethyl methacrylate-polyhedral oligomeric silsesquioxane, and the like.

Figure 3:
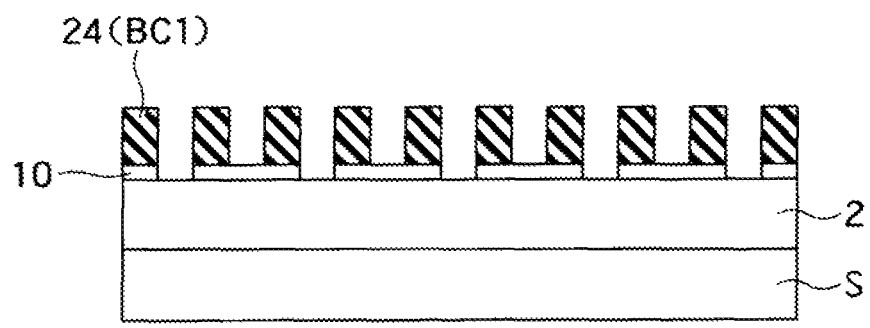

Next, the second polymer unit BC2 having the second block chain is removed by etching, and thereby, as shown in FIG. 3, the layered body of a pattern 24, which is configured of the guide pattern 10, and the first polymer unit BC1 on the guide pattern 10, is formed. The etching may be dry-based reactive ion etching (RIE) using a gas, in addition to wet-based etching using an aqueous solution. For the dry etching according to this embodiment, a mask which has different thickness corresponding to each region may be used to form a negative pattern. When etching using the mask, the amount of processing in the to-be-processed film 2 is different on each region (region 14 and region 11) because the thickness of the mask is different on each region. For example, a thickness corresponding to region 14 is equivalent to thickness of BC2 and the guide pattern 10, and a thickness corresponding to region 11 is equivalent to thickness of BC2. Thus, a negative is formed in the material which has an etch rate that is less than an etch rate of a material of the guide pattern 10. Examples of the aqueous solution and the gas which are usable for etching each of the above types of the to-be-processed film 2, are shown in a table of FIG. 8. For example, the block copolymer BC2 may be first removed using an O2, N2 and or H2 gas, or an aqueous hydrogen peroxide or sulfuric acid, followed by removing the portions of the underlying to-be-processed film 2 with a different chemistry, based upon the material of which it is formed. In the embodiment, for example, the pattern 24 corresponds to a second pattern.

Figure 4:
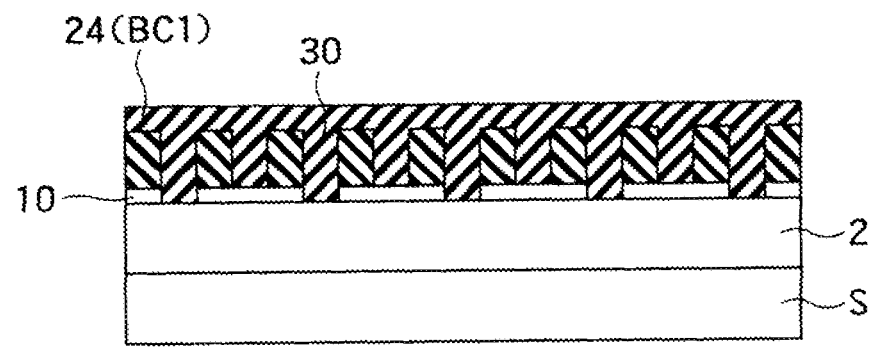

Next, as shown in FIG. 4, a material 30 having an etch rate that is less than an etch rate of a material of the guide pattern 10 and the pattern 24 for a selected etchant is applied so as to cover the pattern 24. As a material 30, for example, a resist material containing silicon (Si), a resist material containing a metal, e.g., titanium (Ti), or the like, may be used, for example, in addition to silsesquioxane resin.

Figure 5:
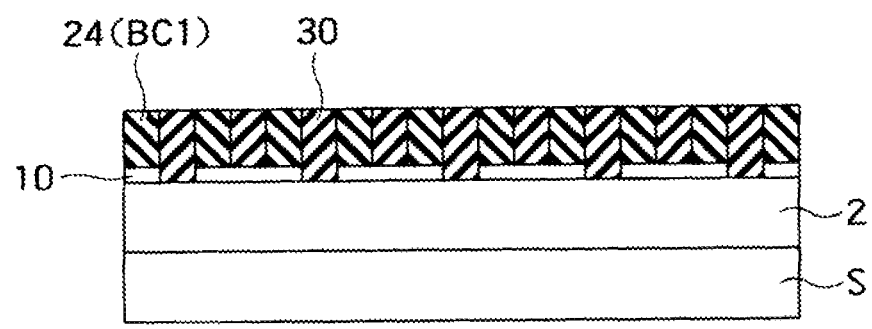

Furthermore, as shown in FIG. 5, the material 30 is removed (etched back) by RIE using an etchant gas species that etches the material 30 until an upper face of the pattern 24 is exposed.

Subsequently, RIE is performed using a different etch gas in the plasma which is selective to preferentially remove the portions of the remaining pattern 24 from the separated layer and the guide pattern 10 which is positioned directly under the pattern 24, is also selectively removed. The resulting pattern in the material 30 is a negative of the pattern 24, i.e., the spaces in pattern 24 are the lines of the resulting pattern 40 in material 30, and the lines in pattern 24 are the spaces in the resulting pattern 40 in the material 30.

Figure 6:
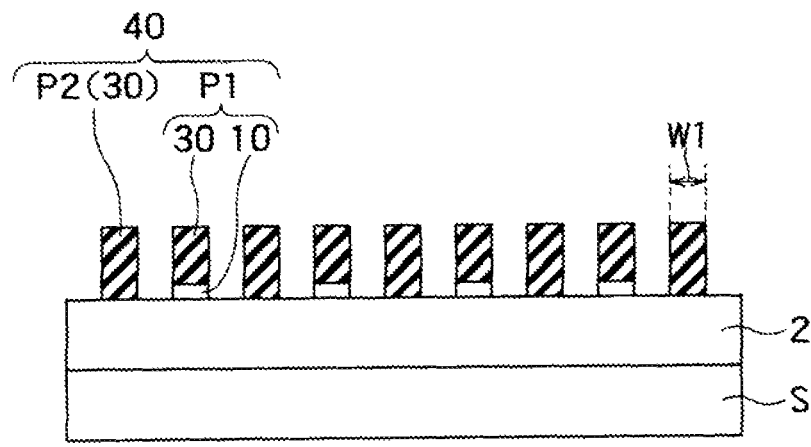

As shown in FIG. 6, a pattern 40 is configured of a layered body portion P1 of the remaining guide pattern 10 and the material thereon, and a portion P2 which is positioned on the to-be-processed film 2 without the guide pattern 10 interposed therebetween. The pattern 40 is formed into a shape in which depressions and protrusions are reversed with respect to the pattern 24. A thickness of the material 30 in the portion P2 is thicker than the thickness of the material 30 of the layered body portion P1, by the thickness of the guide pattern 10. In the embodiment, for example, the pattern 40 corresponds to a third pattern.

Figure 7:
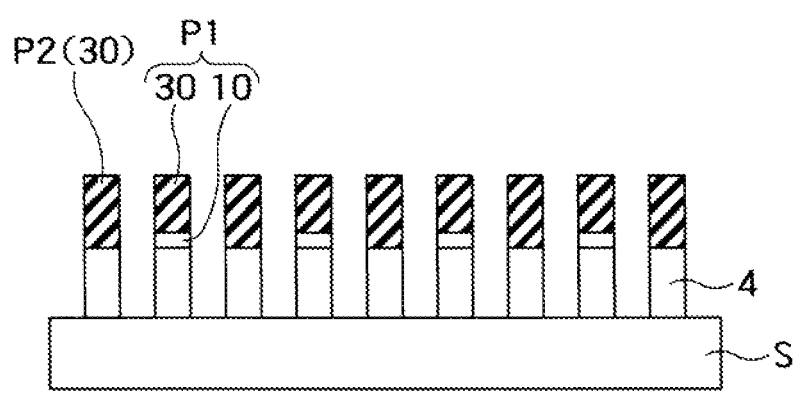

Furthermore, as shown in FIG. 7, when the to-be-processed film 2 is etched using the pattern 40 as a mask, a regular pattern 4 without waviness or unevenness is formed (i.e., the pattern does not have an unevenness due to an influence of the thickness of the guide pattern 10).

Finally, when the pattern 4 is removed after processing the substrate S using the pattern 4 as a mask, a pattern where the unevenness is suppressed in the same manner as the pattern 4, is formed on a surface layer of the substrate S.

According to the pattern forming method of at least one of the embodiments described above, since the pattern 40 (shown in FIG. 6) in which the depressions and the protrusions are reversed with respect to the pattern 24 (shown in FIG. 3) is formed using the material having an etch selection ratio between the guide pattern 10 and the pattern 24, it is possible to form the pattern where unevenness in the pattern is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
   forming a first pattern of a first material on a first film;
   forming a block copolymer layer including a first block polymer chain and a second block polymer chain, on the first pattern;
   forming a second pattern by microphase-separating the block copolymer layer, and removing one of the separated first block polymer chain or the second block polymer chain;
   forming a second film that covers the second pattern by applying a second material having an etch rate that is less than an etch rate of a material of the first pattern and the second pattern;
   selectively removing the second film until the second pattern is exposed;
   forming a third pattern by selectively removing portions of the first pattern exposed in openings of the third pattern using the second pattern as a mask, the third pattern including a first portion that includes a portion of the first pattern and the second film on the first pattern, and a second portion that includes the second film which is formed directly on the first film, wherein the second portion has a film thickness that is greater than a thickness of the second film of the first portion by a thickness of the first pattern; and
   processing the first film using the third pattern as a mask.

2. The method according to claim 1,
   wherein the first material has an affinity to both of the first block polymer chain and the second block polymer chain.

3. The method according to claim 2, wherein the first block polymer chain or the second block polymer chain is removed by at least one of wet etching and dry etching.

4. The method according to claim 2,
   wherein the second material is selected from a resin containing silicon, and a resin containing a metal.

5. The method according to claim 4,
   wherein the resin containing a metal is a silsesquioxane.

6. The method according to claim 4,
   wherein the first block polymer chain or the second block polymer chain is removed by at least one of wet etching and dry etching.

7. The method according to claim 1,
   wherein the second material is selected from a resin containing silicon, and a resin containing a metal.

8. The method according to claim 1,
   wherein the first block polymer chain or the second block polymer chain is removed by at least one of wet etching and dry etching.

9. A pattern forming method comprising:
   forming a first pattern of a first material on a first film;
   forming a block copolymer layer including a first block polymer chain and a second block polymer chain, on the first pattern, wherein the first material has an affinity to both of the first block polymer chain and the second block polymer chain;
   forming a second pattern by microphase-separating the block copolymer layer, and removing one of the first block polymer chain or the second block polymer chain;
   forming a second film that covers the second pattern by applying a second material having an etch rate that is less than an etch rate of a material of the first pattern and the second pattern;
   selectively removing the second film until the second pattern is exposed;
   forming a third pattern by selectively removing the first pattern using the second film as a mask, the third pattern including a first portion that includes the first pattern and the second film on the first pattern, and a second portion that includes the second film which is formed directly on the first film, wherein the second portion includes a film thickness that is greater than a thickness of the second film of the first portion by a thickness of the first pattern;
   removing the second pattern using the second film as a mask; and
   processing the first film using the third pattern as a mask.

10. The method according to claim 9, wherein the first block polymer chain or the second block polymer chain is removed by at least one of wet etching and dry etching.

11. The method according to claim 10,
    wherein the second material is selected from a resin containing silicon, and a resin containing a metal.

12. The method according to claim 11,
    wherein the resin containing a metal is a silsesquioxane.

13. The method according to claim 11,
    wherein the first block polymer chain or the second block polymer chain is removed by at least one of wet etching and dry etching.

14. The method according to claim 9,
    wherein the second material is selected from a resin containing silicon, and a resin containing a metal.

15. The method according to claim 14,
    wherein the first block polymer chain or the second block polymer chain is removed by at least one of wet etching and dry etching.

16. A pattern forming method comprising:
    forming a first pattern of a first material on a first film;
    forming a block copolymer layer including a first block polymer chain and a second block polymer chain, on the first pattern, wherein the first material has an affinity to both of the first block polymer chain and the second block polymer chain;
    forming a second pattern by microphase-separating the block copolymer layer, and removing one of the first block polymer chain or the second block polymer chain, wherein the first block polymer chain or the second block polymer chain is removed by at least one of wet etching and dry etching;
    forming a second film that covers the second pattern by applying a second material having an etch rate that is less than an etch rate of a material of the first pattern and the second pattern;
    selectively removing the second film until the second pattern is exposed;
    forming a third pattern by selectively removing the first pattern using the second film as a mask, the third pattern including a first portion that includes the first pattern and the second film on the first pattern, and a second portion that includes the second film which is formed directly on the first film, wherein the second portion includes a film thickness that is greater than a thickness of the second film of the first portion by a thickness of the first pattern;
    removing the second pattern using the second film as a mask; and
    processing the first film using the third pattern as a mask.

17. The method according to claim 16,
wherein the second material is selected from a resin containing silicon, and a resin containing a metal.

18. The method according to claim 17,
wherein the metal comprises titanium.

19. The method according to claim 16,
wherein the resin containing a metal is a silsesquioxane.

20. The method according to claim 19,
wherein the metal comprises titanium.

* * * * *